United States Patent
Schreiber et al.

(10) Patent No.: US 12,327,608 B2
(45) Date of Patent: Jun. 10, 2025

(54) WRONG WAY READ-BEFORE WRITE SOLUTIONS IN SRAM

(71) Applicants: Advanced Micro Devices, Inc., Santa Clara, CA (US); ATI Technologies ULC, Markham (CA)

(72) Inventors: Russell Schreiber, Austin, TX (US); Sahilpreet Singh, Markham (CA)

(73) Assignees: Advanced Micro Devices, Inc., Santa Clara, CA (US); ATI Technologies ULC, Markham (CA)

( * ) Notice: Subject to any disclaimer, the term of this patent is extended or adjusted under 35 U.S.C. 154(b) by 62 days.

(21) Appl. No.: 18/090,736

(22) Filed: Dec. 29, 2022

(65) Prior Publication Data

US 2024/0221805 A1 Jul. 4, 2024

(51) Int. Cl.
*G11C 7/12* (2006.01)
*G11C 5/14* (2006.01)
*G11C 7/10* (2006.01)

(52) U.S. Cl.
CPC ............. *G11C 7/12* (2013.01); *G11C 5/14* (2013.01); *G11C 7/1096* (2013.01)

(58) Field of Classification Search
CPC ............ G11C 7/12; G11C 5/14; G11C 7/1096
See application file for complete search history.

(56) References Cited

U.S. PATENT DOCUMENTS

2015/0302917 A1* 10/2015 Grover ................. G11C 11/412
365/51
2024/0021241 A1* 1/2024 Haraguchi ........... G11C 11/413

* cited by examiner

*Primary Examiner* — Xiaochun L Chen
(74) *Attorney, Agent, or Firm* — Polansky & Associates, P.L.L.C.; Paul J. Polansky; Nathan H. Calvert (57) ABSTRACT

A static random-access memory (SRAM) circuit includes an SRAM bitcell coupled to a word line, a bit line and a complementary bit line. A precharge circuit is coupled to the bit line and the complementary bit line and includes a precharge input. A first keeper transistor is coupled to the bit line and a second keeper transistor is coupled to the complementary bit line. A write driver circuit includes a select input receiving a select signal, a write data input, and a write data compliment input, and is operable to write a data bit to the SRAM bitcell. A combinatorial logic circuit provides a precharge signal to the precharge circuit based on the select signal and a bit line precharge signal.

18 Claims, 8 Drawing Sheets

WRONG WAY READ-BEFORE WRITE SOLUTIONS IN SRAM

BACKGROUND

Static random-access memory (SRAM) is used in various roles within semiconductor integrated circuits (ICs). For example, cache memory is typically implemented with SRAM in processor ICs and systems-on-chip (SoCs). Local memory for various controllers and other on-board memory may also use SRAM. There is also a small market for dedicated SRAM chips. SRAM is typically faster than dynamic random-access memory (DRAM) and does not require refresh, but requires higher power.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

A static random-access memory (SRAM) circuit includes an SRAM bitcell connected to a word line, a bit line and a complementary bit line. A precharge circuit is coupled to the bit line and the complementary bit line and includes a precharge input. A first keeper transistor is coupled to the bit line and a second keeper transistor is coupled to the complementary bit line. A write driver circuit includes a select input receiving a select signal, a write data input, and a write data compliment input, and is operable to write a data bit to the SRAM bitcell. A combinatorial logic circuit provides a precharge signal to the precharge circuit based on the select signal and a bit line precharge signal.

A method of operating an SRAM memory circuit incudes, responsive to a precharge signal, charging a bit line and a complementary bit line of an SRAM bitcell. The method includes maintaining a charge level of the bit line with a first keeper transistor, and maintaining a charge level of the complimentary bit line with a second keeper transistor. The method includes producing the precharge signal based on a select signal and a bit line precharge signal, and responsive to the select signal, writing a data bit to the SRAM bitcell.

An integrated circuit includes an SRAM circuit. The SRAM circuit includes an SRAM bitcell connected to a word line, a bit line and a complementary bit line. A precharge circuit is coupled to the bit line and the complementary bit line and includes a precharge input. A first keeper transistor is coupled to the bit line and a second keeper transistor is coupled to the complementary bit line. A write driver circuit includes a select input receiving a select signal, a write data input, and a write data compliment input, and is operable to write a data bit to the SRAM bitcell. A combinatorial logic circuit provides a precharge signal to the precharge circuit based on the select signal and a bit line precharge signal.

Figure 1:
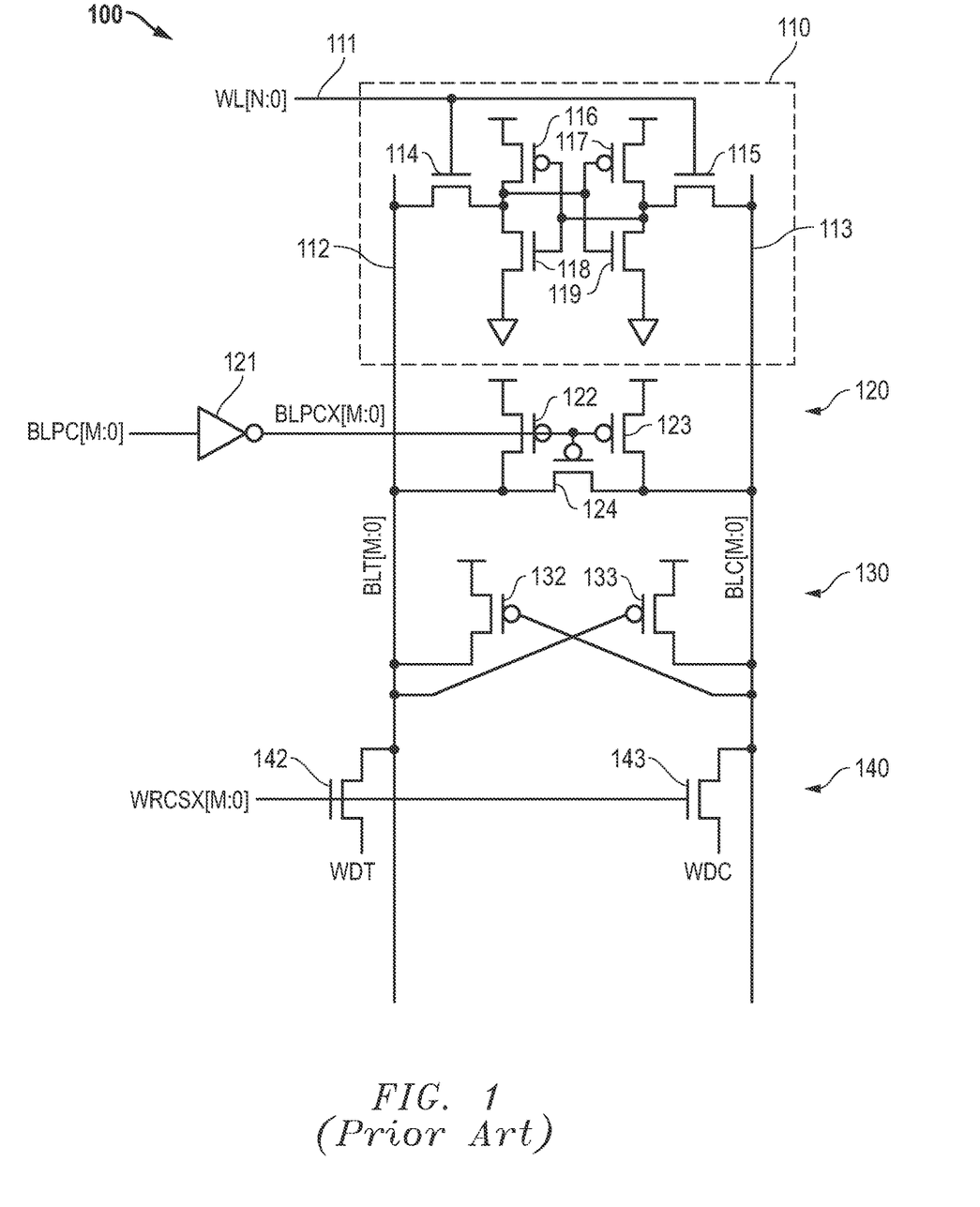
FIG. 1 illustrates in circuit diagram form an SRAM circuit according to the prior art.

FIG. 1 illustrates in circuit diagram form an SRAM circuit 100 according to the prior art. SRAM circuit 100 generally includes an SRAM bitcell 110, a precharge circuit 120, a cross pullup circuit 130, and a write driver circuit 140.

SRAM bitcell 110 is coupled to a word line 111, a bit line 112, a complementary bit line 113, and six transistors 114-119. Transistors 114 and 115 have gates connected to word line 111 and function as access transistors. Transistors 116 and 118 function as a first inverter, and transistors 117 and 119 function as a second inverter cross coupled to the first inverter in a standard six transistor (6T) SRAM bitcell arrangement.

Precharge circuit 120 is connected to bit line 112 and complementary bit line 113. Precharge circuit 120 includes a precharge input labelled "BLPC[M:0]", an inverter 121, and three transistors 122-124. Inverter 121 has an input receiving a bit line precharge signal BLPC, and an output providing an active-low bit line precharge signal BLPCX [M:0]. Transistors 122 and 123 are P-type metal-oxide semiconductor (PMOS) transistors with their sources connected to a voltage supply, and their drains connected to bit line 112 and complementary bit line 113, respectively. Transistor 124 is a PMOS transistor with a first terminal connected to bit line 112 and a second terminal connected to complementary bit line 113. The gates of transistors 122-124 are connected to the output of inverter 121 to receive the BLPCX signal.

Cross pullup circuit 130 includes a keeper transistor 132 and a keeper transistor 133, which are both PMOS transistors. Keeper transistor 132 has a source connected to the voltage supply, a drain connected to bit line 112, and a gate connected to bit line 113. Keeper transistor 133 has a source connected to the voltage supply, a drain connected to bit line 113 and a gate connected to bit line 112.

In operation, SRAM circuit 100 is present in an arrays for which a bus of world line signals, the signal for SRAM circuit 100 labelled "WL[N:0]," select which row is active, and a bus write column select signals, with the signal for SRAM circuit 100 labelled "WRCSX[M:0]", select which column is active. Write driver circuit 140 includes a select input receiving write column select signal WRCSX[M:0], a write data input receiving a write data signal labelled "WDT", and a write data compliment input receiving a complimentary write data signal labelled "WDC". Write driver circuit 140 includes two transistors 142 and 143, which are N-type metal-oxide semiconductor (NMOS) transistors. Transistor 142 has a drain connected to bit line 112, a source receiving the WDT signal, and a gate receiving the WRCS signal. Transistor 143 has a drain connected to bit line 113, a source receiving the WDC signal, and a gate receiving the WRCS signal.

In operation, a LOW value of a word line signal WL[N:0] on word line 111 causes SRAM bitcell 110 to be deselected, and a HIGH value allows read and write operations. During write operations, write driver circuit 140 is operable to write a data bit to the SRAM bitcell 110. Precharge circuit 120 is used to pre-charge bit lines 112 and 113 to a level which is needed for robust operation during reads and writes. Cross pullup circuit 130 holds one bit line high after the other has fallen as the result of either a read operation or if the other is driven low by the write driver.

Figure 2:
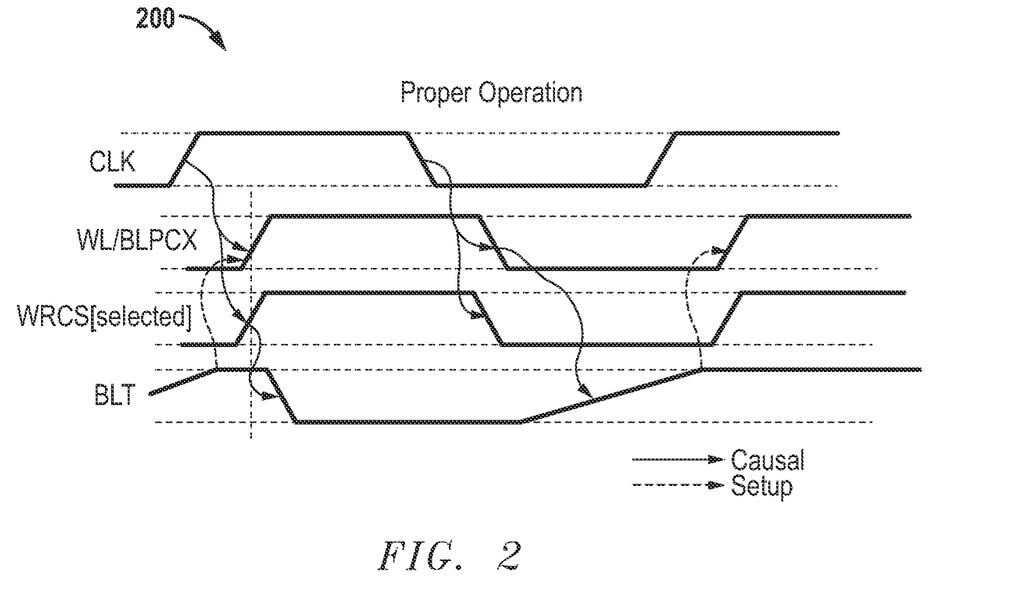
FIG. 2 shows a timing diagram depicting a normal write operation of the SRAM circuit of FIG. 1.

FIG. 2 shows a timing diagram 200 depicting a normal write operation of SRAM circuit 100. The horizontal axis depicts time and the vertical axis shows signal levels of several signals that transition between digital LOW and HIGH voltages. As shown on the legend, dotted arrows depict necessary timing setups, while solid arrows depict causal relationships. A clock signal "CLK" depicts the clock signal driving the memory access circuitry. The WL/BLPCX [M:0] signal depicts the resulting WL[N:0] signal on word line 111, and the BLPCX[M:0] signal for controlling precharge circuit 120 in an active LOW arrangement in which the BLPCX signal going low causes the bit line to be precharged. The signal WRCS is labeled "selected" to indicate the signal is shows BLPCX[M:0] for cells in which the memory access circuitry's decoder has selected this particular column.

As can be seen by the dotted arrows, the rising BLT[M:0] signal needs to reach a HIGH level before the WL[N:0] and BLPCX signals reach transition to allow the write operation to operate correctly. The relatively large size of the bit line causes the bit line precharge to be slow as depicted on the BL signal.

Figure 3:
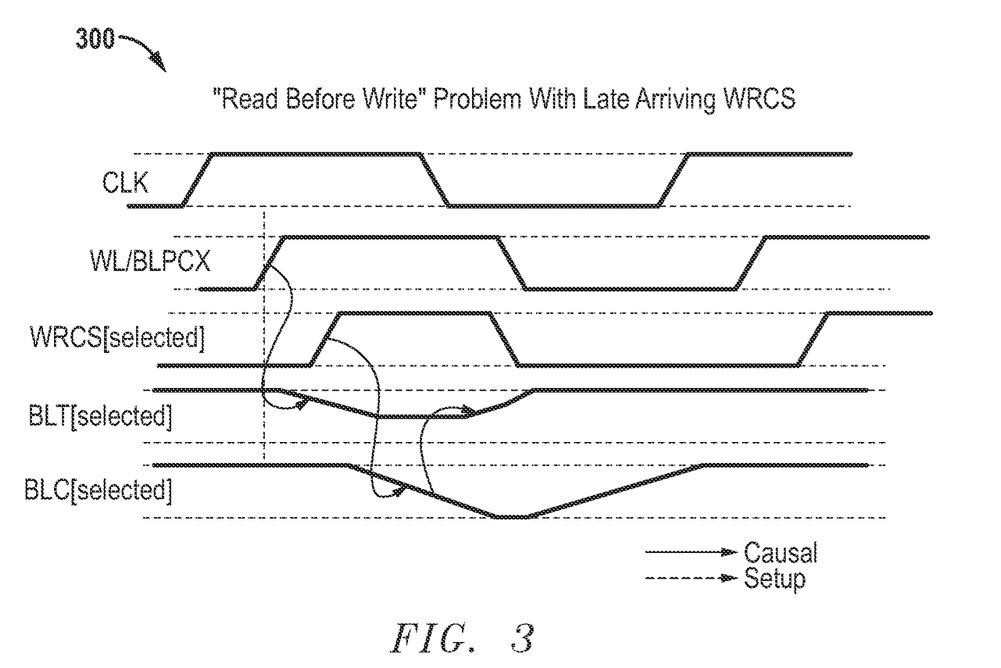
FIG. 3 shows a timing diagram depicting a common failure scenario known as wrong way read before write, or "Read Before Write"

FIG. 3 shows a timing diagram 300 depicting a common failure scenario known as wrong way read before write, or "Read Before Write". The horizontal axis depicts time and the vertical axis shows signal levels of several signals that transition between digital LOW and HIGH voltages. Dotted arrows depict necessary timing setups, while solid arrows depict causal relationships. The Read Before Write problem arises form a late-arriving WRCS signal. Generally, for a successful write cycle, the bit line precharge should complete and precharge circuit 120 should be turned off to leave bit lines 112 and 113 precharged before a write operation begins. However, if the WRCS signal arrives at write driver circuit 140 too late, SRAM bitcell 110 starts to behave as if a read operation is occurring, and one of the bit lines starts to drop in voltage as depicted in the signal BLT[M:0]. When the WRCS signal finally does arrive, cross pullup circuit 130 may have already activated to begin pulling up the BLC[M:0] signal, meaning that write driver circuit 140 has to "fight" cross pullup circuit 130 to drive the correct value onto bit line 112. This timing can cause incorrect data to be written to the SRAM bitcell.

Figure 4:
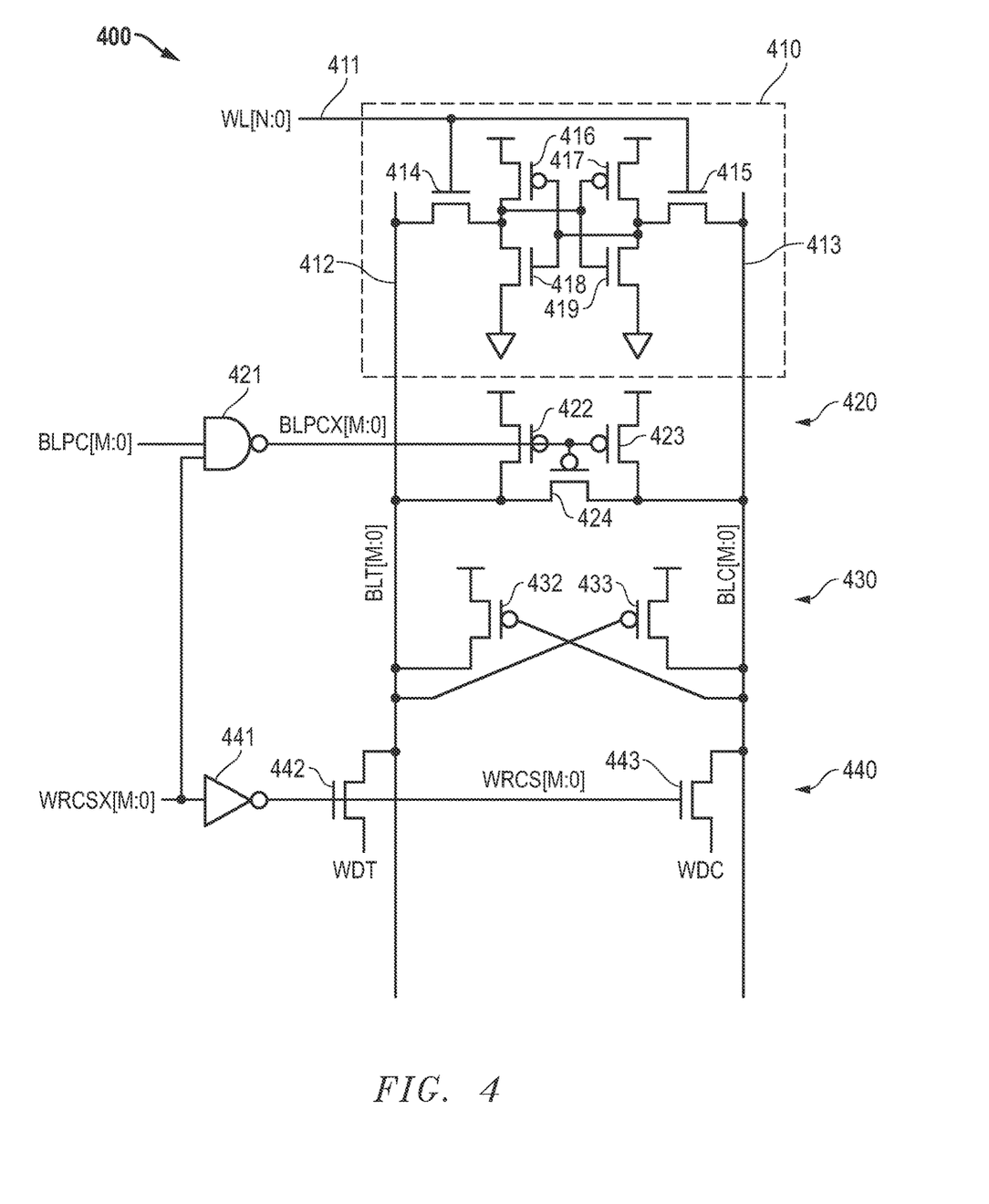
FIG. 4 illustrates in circuit diagram form an SRAM circuit according to some additional embodiments.

FIG. 4 illustrates in circuit diagram form an SRAM circuit 400 according to some embodiments. SRAM circuit 400 generally includes an SRAM bitcell 410, a precharge circuit 420, a keeper circuit 430, and a write driver circuit 440.

SRAM bitcell 410 includes a word line 411, a bit line 412, a complementary bit line 413, and six transistors 414-419. Transistors 414 and 415 are have gates connected to word line 411 and function as access transistors. Transistors 416 and 418 function as a first inverter, and transistors 417 and 419 function as a second inverter cross coupled to the first inverter in a standard six transistor (6T) SRAM bitcell arrangement. In some embodiments, SRAM bitcell 410 is supplied with a first voltage supply, and write driver circuit 440 is supplied with a second voltage supply having a voltage level different than the first voltage supply.

Precharge circuit 420 is connected bit line 412 and the complementary bit line 413, and includes a precharge input labelled "BLPCX[M:0]", and three transistors 422-424. A NAND gate 421 has an input receiving a bit line precharge signal BLPC[M:0], a second input receiving the WRCSX [M:0] signal, and an output providing the BLPCX[M:0] signal. While a NAND gate is shown in this embodiment, other combinatorial logic circuits may also be used to provide the same functionality. Transistors 422 and 423 are PMOS transistors with their sources connected to a voltage supply, and their drains connected to bit line 412 and complementary bit line 413, respectively. Transistor 424 is a PMOS transistor with a first terminal connected to bit line 412 and a second terminal connected to complementary bit line 413. The gates of transistors 422-424 are connected to the output of NAND gate 421 to receive the BLPCX[M:0] signal.

Keeper circuit 430 includes a keeper transistor 432 and a keeper transistor 433, which are both PMOS transistors. Keeper transistor 432 has a source connected to the voltage supply, a drain connected to bit line 412, and a gate connected to bit line 413. Keeper transistor 433 has a source connected to the voltage supply, a drain connected to bit line 413 and a gate connected to bit line 412.

Write driver circuit 440 includes a select input receiving a write column select signal, labelled WRCS, a write data input receiving a write data signal labelled "WDT", and a write data compliment input receiving a complimentary write data signal labelled "WDC". Write data circuit 440 includes two transistors 442 and 443, which are N-type metal-oxide semiconductor (NMOS) transistors. Transistor 442 has a drain connected to bit line 412, a source receiving the WDT signal, and a gate receiving the WRCS[M:0] signal. Transistor 443 has a drain connected to bit line 413, a source receiving the WDC signal, and a gate receiving the WRCS signal. An inverter 441 receives the WRCS signal in a complement form, labelled "WRCSX[M:0]", for use with NAND gate 421, and has an output providing the WRCS signal in its true, non-complement, form to write driver circuit 440.

In operation, a LOW value of a word line signal "WL[N: 0]" on word line 411 causes SRAM bitcell 410 to be deselected, and a HIGH value allows read and write operations. During write operations, write driver circuit 440 is operable to write a data bit to the SRAM bitcell 410. Precharge circuit 420 is used to charge bit lines 412 and 413 to allow for correct read and write operation. Keeper circuit 430 maintains the state of one bit line when the other is discharged as a result of a read or write operation. The combinatorial logic circuit, in this embodiment NAND gate 421, provides the precharge signal BLPCX[M:0] to precharge circuit 420 based on the write column select signal WRCSX[M:0] and the bit line precharge signal BLPC. Because in some timing and layout scenarios, the BLPC signal may change values later than the WRCSX[M:0] signal, the WRCSX[M:0] signal is also used to turn off precharge circuit 420 of a selected column when it arrives. The combinatorial logic circuit is operable to, responsive to the WRCSX[M:0] signal arriving for a write operation, stop or interrupts a charging action of the selected column's precharge circuit before the bit lines are fully charged to allow write driver circuit 440 to begin driving the data onto the bit lines before the bit lines are 412 and 413 are fully charged while allowing the unselected columns to continue precharging to the full rail voltage, as further described below with respect to FIG. 5. If the BLPC signal transitions to a logic low before the WRCSX[M:0] signal, the precharge is stopped according to its normal operation. In this way, SRAM circuit 400 mitigates the wrong way read before write problem by allowing the write data to drive onto the bit lines early while allowing unselected columns to fully precharge.

Figure 5:
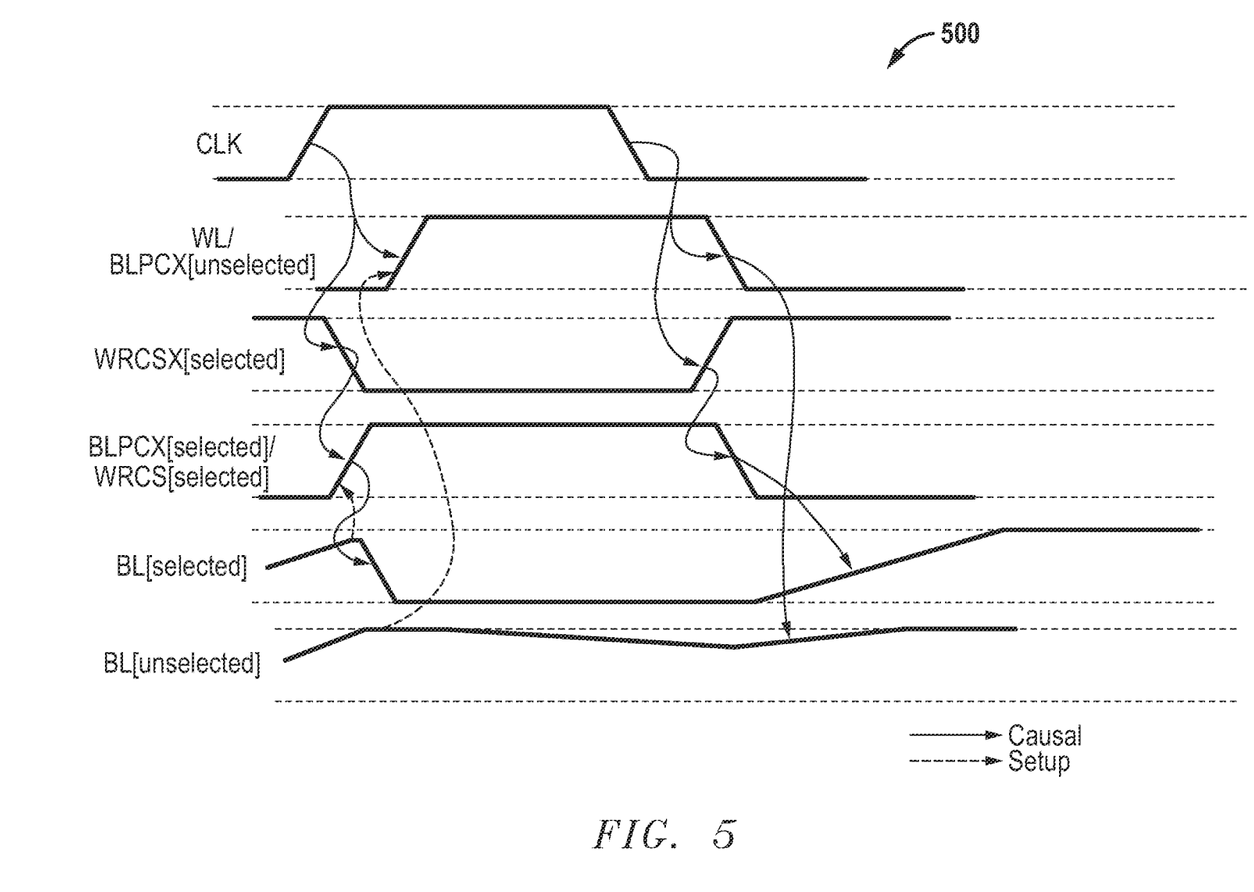
FIG. 5 shows a timing diagram depicting a write operation of the SRAM circuit of FIG. 4.

FIG. 5 shows a timing diagram 500 depicting a write operation of SRAM circuit 400. The horizontal axis depicts time and the vertical axis shows signal levels of several signals that transition between digital LOW and HIGH voltages. Dotted arrows depict necessary timing setups, while solid arrows depict causal relationships. Because in some timing and layout scenarios, the BLPC signal may transition later than the WRCSX[M:0] signal as depicted, the WRCSX[M:0] signal is also used to turn off precharge circuit 420 for the selected column when it arrives. This behavior can be seen in the WRCSX[M:0] signal shown causing the BLPCX signal to go high. As can be seen in the BL signal, bit line 412 is fully charged when BLPCX goes high because of WRCSX going high, turning off precharge circuit 420. The write data vale of "0" can then be driven onto bit line 412 without any possible interference from precharge circuit 420. As can be understood from the diagram, SRAM circuit 400 helps to mitigate the read before write problem by allowing early driving of the write data on the bit lines. This also helps the speed of operation by allowing timing margins to be tightened and other operations to be performed at a faster frequency.

Figure 6:
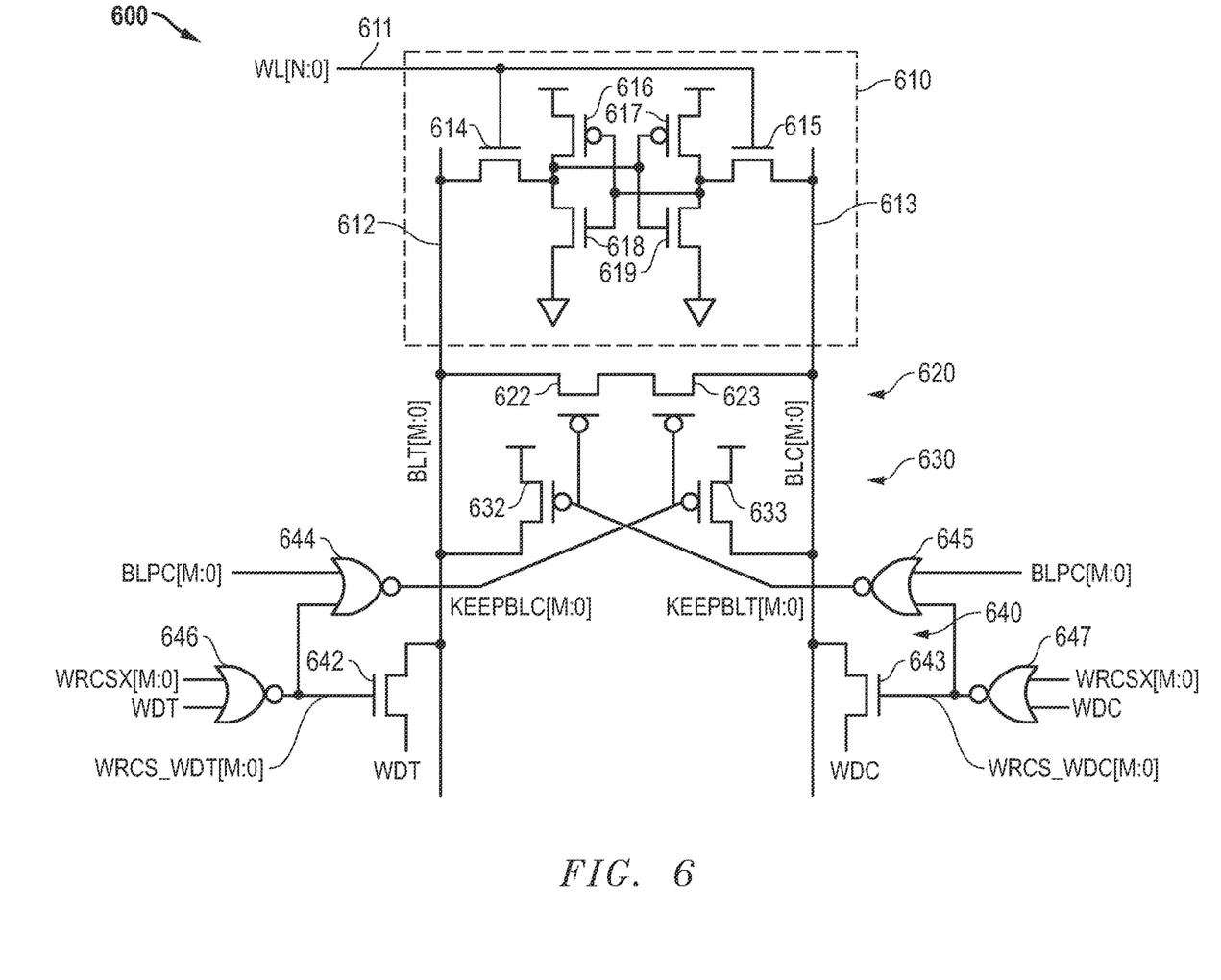
FIG. 6 illustrates in circuit diagram form an SRAM circuit according to some additional embodiments.

FIG. 6 illustrates in circuit diagram form an SRAM circuit 600 according to some embodiments. SRAM circuit 600 generally includes an SRAM bitcell 610, an equalization circuit 620, a precharge/keeper circuit 630, and a write driver circuit 640.

SRAM bitcell 610 includes a word line 611, a bit line 612, a complementary bit line 613, and six transistors 614-619. Transistors 614 and 615 are have gates connected to word line 611 and function as access transistors. Transistors 616 and 618 function as a first inverter, and transistors 617 and 619 function as a second inverter cross coupled to the first inverter in a standard six transistor (6T) SRAM bitcell arrangement. In some embodiments, SRAM bitcell 610 is supplied with a first voltage supply, and write driver circuit 640 is supplied with a second voltage supply having a voltage different than the first voltage supply.

Equalization circuit 620 is connected to bit line 612 and the complementary bit line 613 and includes two inputs receiving respective precharge signals labelled "KEEPBLC [M:0]" and "KEEPBLT[M:0]", and two transistors 622-623. Equalization circuit 620 includes transistors 622 and 623, which are PMOS transistors with their sources connected to each other, and their drains connected to bit line 612 and complementary bit line 613, respectively. The control of equalization circuit 620 is performed in conjunction with control of precharge/keeper circuit 630, with the gates of transistors 622-623 connected to keeper circuit 630 as further described below.

Precharge/keeper circuit 630 includes a precharge/keeper transistor 632 and a precharge/keeper transistor 633, which are both PMOS transistors. Precharge/keeper transistor 632 has a source connected to the voltage supply, a drain connected to bit line 612, and a gate. Precharge/Keeper transistor 633 has a source connected to the voltage supply, a drain connected to complementary bit line 613 and a gate. A combinatorial logic circuit including two NOR gates 644 and 645 is used to control precharge/keeper circuit 630 and equalization circuit 620 in this embodiment. NOR gate 644 has an input receiving a bit line precharge signal BLPC[M:0], a second input, and an output connected to the gate of keeper transistor 633 and to the gate of transistor 623, providing the signal KEEPBLC[M:0]. NOR gate 645 has an input receiving the bit line precharge signal BLPC[M:0], a second input, and an output connected to the gate of keeper transistor 632 and to the gate of transistor 622 KEEPBLT [M:0]. While a NOR gate is shown in this embodiment, other combinatorial logic circuits may also be used to provide the same functionality.

Write driver circuit 640 includes a select input receiving a write column select signal labelled "WRCSX[M:0]", a write data input receiving a write data signal labelled "WDT", and a write data compliment input receiving a complimentary write data signal labelled "WDC". Write data circuit 640 includes two transistors 642 and 643, which are N-type metal-oxide semiconductor (NMOS) transistors. Transistor 642 has a drain connected to bit line 612, a source receiving the WDT signal, and a gate receiving the output of NOR gate 646. Transistor 643 has a drain connected to complementary bit line 613, a source receiving the WDC signal, and a gate connected to the output of NOR gate 647. In this embodiment, write driver circuit 640 is also controlled by a portion of a combinatorial logic circuit including two NOR gates 646 and 647. NOR gate 646 has a first input receiving the WRCSX[M:0] signal, a second input receiving the WDT signal, and an output connected to the gate of transistor 642 and the second input of NOR gate 644. NOR gate 647 has a first input receiving the WRCSX[M:0] signal, a second input receiving the WDC signal, and an output connected to the gate of transistor 643 and the second input of NOR gate 645. In other embodiments, the sources of transistors 642 and 643 may be connected to ground or connected to receive negative voltage versions of WDT and WDC signals shifted to a range including negative voltages.

In operation, equalization circuit 620 is used to equalize bit lines 612 and 613 to ensure a correct read operation. Precharge/keeper circuit 630 drives bit lines 612 and 613 high when they are not actively driven to a voltage level. The depicted combinatorial logic circuit, including NOR gates 644-647, controls equalization circuit 620, precharge/keeper circuit 630, and write driver circuit 640. The combinatorial logic circuit is operable to, responsive to the WRCSX[M:0] signal transitioning, stop or interrupt a charging action of the precharge circuit before the bit lines are fully charged to allow write driver circuit 640 to begin driving write data onto the bit lines before the bit lines are 612 and 613 are fully charged, as further described below with respect to FIG. 7. However, for the bit line to which a "1" value is written, this circuit also employs one of keeper transistors 632 and 633 as a pull up driver, providing a "hard pullup" of the relevant bit line voltage, and improving performance for Read Before Write scenarios. This feature requires less set up time for the write data values on signals WDC and WDT, and allows timing margins to be relaxed, thereby allowing increased frequency of operations.

Figure 7:
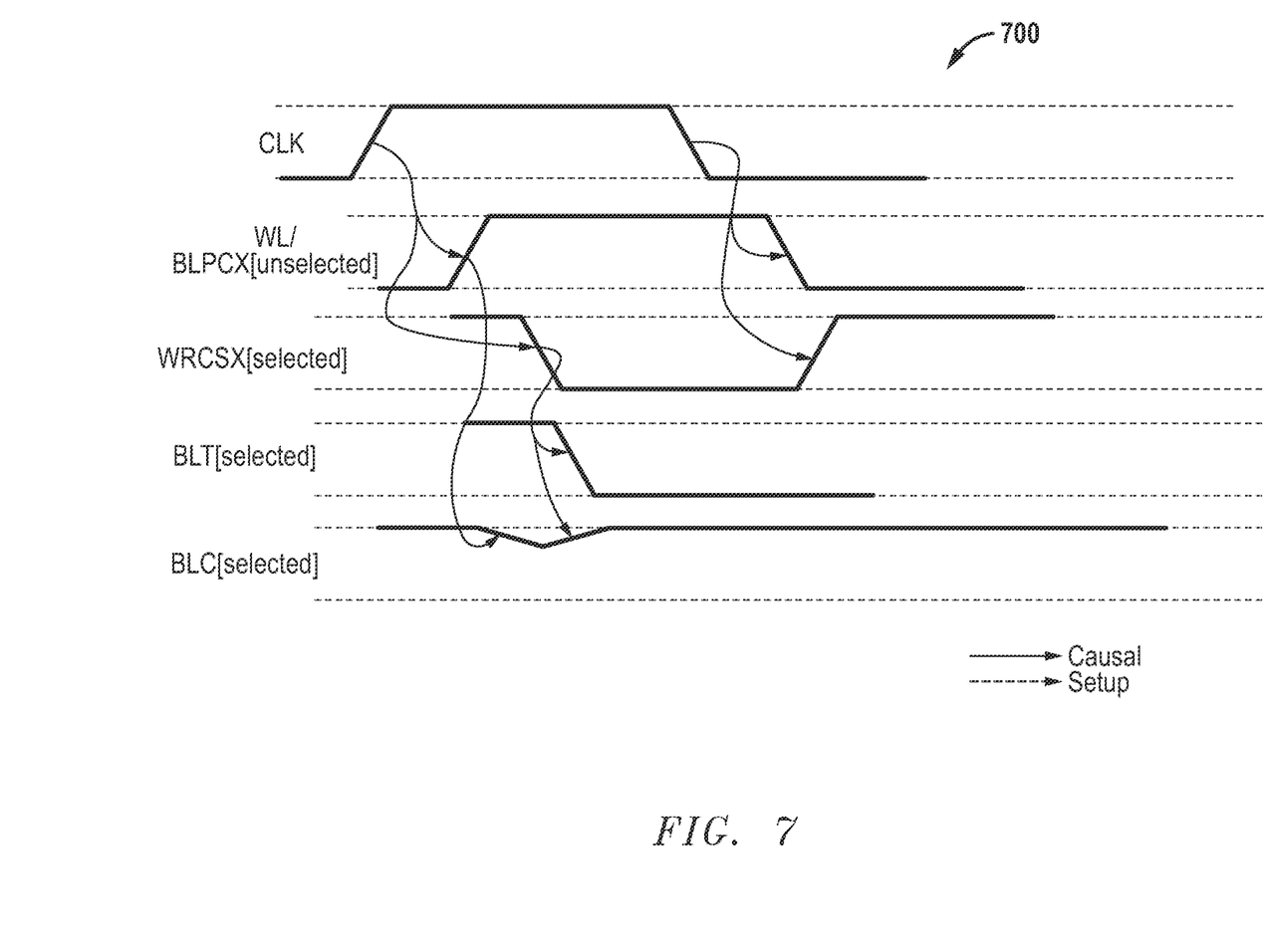
FIG. 7 shows a timing diagram depicting a write operation of the SRAM circuit of FIG. 6.

FIG. 7 shows a timing diagram 700 depicting a write operation of SRAM circuit 600. The horizontal axis depicts time and the vertical axis shows signal levels of several signals that transition between digital LOW and HIGH voltages. Dotted arrows depict necessary timing setups, while solid arrows depict causal relationships.

The depicted signals illustrate the performance of SRAM circuit 600 in the situation discussed with respect to FIG. 3, a Read Before Write problem in which the write column select signal, in this case WRCSX[M:0], arrives significantly later than the BLPC[M:0] and WL[N:0] signals transitions to end the precharging process and begin a read or write. A signal "WL/BLPCX" on diagram 700 shows the signals for both WL[N:0] and KEEPBLC[M:0] and KEEP-BLT[M:0]. In this example, a "0" is written so BLC[M:0] needs to be pulled up to a HIGH value during the write process. Since the WRCSX[M:0] signal arrives late, the BLC[M:0] signal level starts to discharge as the result of the bitcell essentially reading what was previously stored. As can be seen, precharge/keeper circuit 630 starts to pull BLC[M:0] higher because of the late-arriving WRCSX[M:0] eliminating the wrong way read. However, NOR gates 646 and 647 cause precharge/keeper circuit 630 to turn OFF transistor 632 with the arrival of WRCS_WDT[M:0], allowing write driver circuit 640 to pulldown BLT[M:0] and pull up BLC[M:0] with a "hard pullup", that is, one half of precharge/keeper circuit 630 is employed to pull complementary bit line 613 up quickly in time to correctly store a "1" value into bitcell 610 through bit line 612 or complementary bit line 613, respectively.

Figure 8:
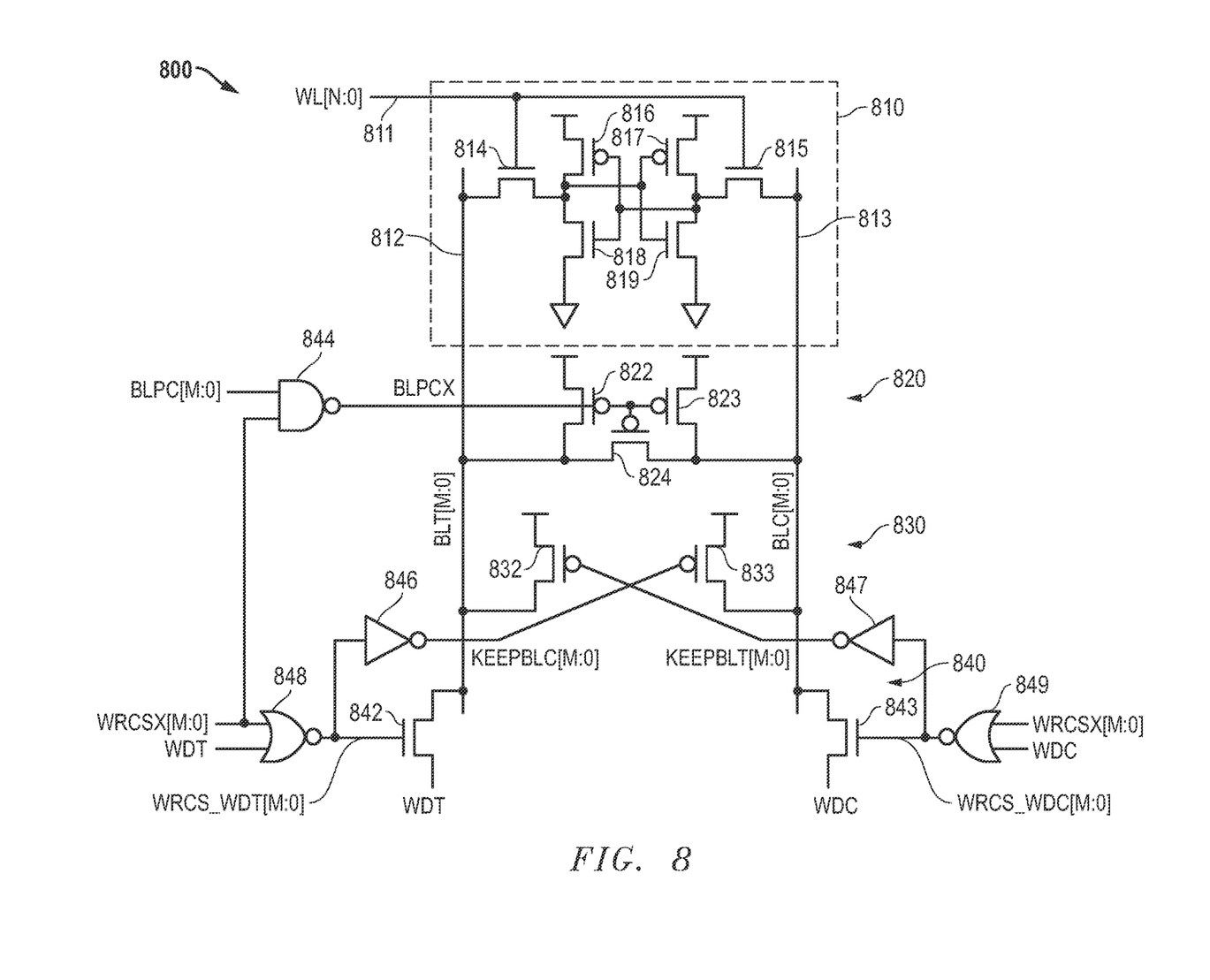
FIG. 8 illustrates in circuit diagram form an SRAM circuit 800 according to some embodiments.

FIG. 8 illustrates in circuit diagram form an SRAM circuit 800 according to some embodiments. SRAM circuit 800 generally includes an SRAM bitcell 810, a precharge circuit 820, a keeper circuit 830, and a write driver circuit 840. SRAM circuit 800 generally operates to combine the features of both SRAM circuit 400 and SRAM circuit 600.

SRAM bitcell 810 includes a word line 811, a bit line 812, a complementary bit line 813, and six transistors 814-819. Transistors 814 and 815 are have gates connected to word line 811 and function as access transistors. Transistors 816 and 818 function as a first inverter, and transistors 817 and 819 function as a second inverter cross coupled to the first inverter in a standard six transistor (6T) SRAM bitcell arrangement. In some embodiments, SRAM bitcell 610 is supplied with a first voltage supply, and write driver circuit 640 is supplied with a second voltage supply having a voltage level different than the first voltage supply.

Precharge circuit 820 is connected to bit line 812 and the complementary bit line 813 and including an input receiving a precharge signal labelled "BLPCX[M:0]", and three transistors 822-824. Transistors 822 and 823 are PMOS transistors with their sources connected to a voltage supply, and their drains connected to bit line 812 and complementary bit line 81, respectively. Transistor 824 is a PMOS transistor with a first terminal connected to bit line 812 and a second terminal connected to complementary bit line 813. A combinatorial logic circuit including a NAND gate 844 provides the BLPCX[M:0] signal to the gates of transistors 822-824. NAND gate 844 has a first input receiving a precharge control signal labeled "BLPC", a second input, and an output providing the BLPCX signal.

Keeper circuit 830 includes write operation keeper transistors 832 and 833, which are both PMOS transistors. Keeper transistor 832 has a source connected to the voltage supply, a drain connected to bit line 812, and a gate. Write operation keeper transistor 833 has a source connected to the voltage supply, a drain connected to complementary bit line 813 and a gate.

Write driver circuit 840 includes a select input receiving a write column select signal labelled "WRCSX[M:0]", a write data input receiving a write data signal labelled "WDT", and a write data compliment input receiving a complementary write data signal labelled "WDC". Write data circuit 840 includes two transistors 842 and 843, which are N-type metal-oxide semiconductor (NMOS) transistors. Transistor 842 has a drain connected to bit line 812, a source receiving the WDT signal, and a gate receiving the WRCS signal. Transistor 843 has a drain connected to complementary bit line 813, a source receiving the WDC signal, and a gate receiving the WRCS signal. In this embodiment, write driver circuit 840 is also controlled by a portion of a combinatorial logic circuit including two NOR gates 848 and 849. NOR gate 848 has a first input receiving the WRCSX[M:0] signal, a second input receiving the WDT signal, and an output providing a signal labelled "WRCS_WDT[M:0]" which is fed to the gate of transistor 842 and the input of inverter 846. NOR gate 849 has a first input receiving the WRCSX[M:0] signal, a second input receiving the WDC signal, and an output providing a signal labelled "WRCS_WDC[M:0]" which is fed to the gate of transistor 843 and the input of inverter 847. In some embodiments, the source of transistors 842 and 843 may be connected to ground or connected to receive negative voltage versions of WDT and WDC signals shifted to a range including negative voltages.

In this embodiment, precharge circuit 820, keeper circuit 830, and write driver circuit 840 are controlled in a manner combining the effects and benefits of SRAM circuit 400 (FIG. 4) and SRAM circuit 600 (FIG. 6). The combinatorial logic circuit also includes two NOR gates 848 and 849, and two inverters 846 and 847, employed in controlling keeper circuit 830 and write driver circuit 840. NOR gate 848 has an input receiving the WRCSX[M:0] signal, a second input receiving the WDT signal, and an output connected to the input of inverter 846 and to the gate of transistor 842. NOR gate 849 has an input receiving the WRCSX[M:0] signal, an input receiving the WDC signal, and an output connected to the input of inverter 847 and to the gate of transistor 843. The output of inverter 846 is connected to the gate of keeper transistor 833 and provides a signal labelled "KEEPBLC[M:0]". The output of inverter 847 is connected to the gate of keeper transistor 832 and provides a signal labelled "KEEPBLT[M:0]". While a NOR gate is shown in this embodiment, other combinatorial logic circuits may also be used to provide the same functionality.

In operation, precharge circuit 820 is used to charge bit lines 812 and 813 to reduce delay in operations. Keeper circuit 830 maintains the state of bit lines 812 and 813 when they are not actively driven to a voltage level. The combinatorial logic circuit including NAND gate 844 and NOR gates 848 and 849 controls precharge circuit 820, keeper circuit 830, and write driver circuit 840. NOR gates 848 and 849 control driver circuit 840 similarly to NOR gates 646 and 647 (FIG. 6). That is, until signal WRCSX[M:0] arrives to enable the write driver circuit, the values of WDT and WDC are not driven onto bit lines 812 and 813. Keeper circuit 830 is controlled by the output of inverters 846 and 847, turning off based on the arrival of WRCSX[M:0], and preventing a Read Before Write problem in many cases. Precharge circuit 820 is turned off by the arrival of the WRCSX[M:0] signal for enabling a write, therefore improving the performance in different timing scenarios as discussed with respect to FIG. 4. If WRCSX[M:0] arrives early (before BLPC transitions to turn off precharge circuit 820), precharge circuit 820 is turned off, allowing early driving of write data onto the bit lines. If the WRCSX[M:0] signal arrives late, the hard pullup allows SRAM circuit 800 to overcome the problems drooping bit line voltages discussed regarding the Read Before Write problem. Therefore, more flexibility is provided in the timing of WRCSX[M:0] in relation to the WL[N:0] and BLPC signals.

Figure 9:
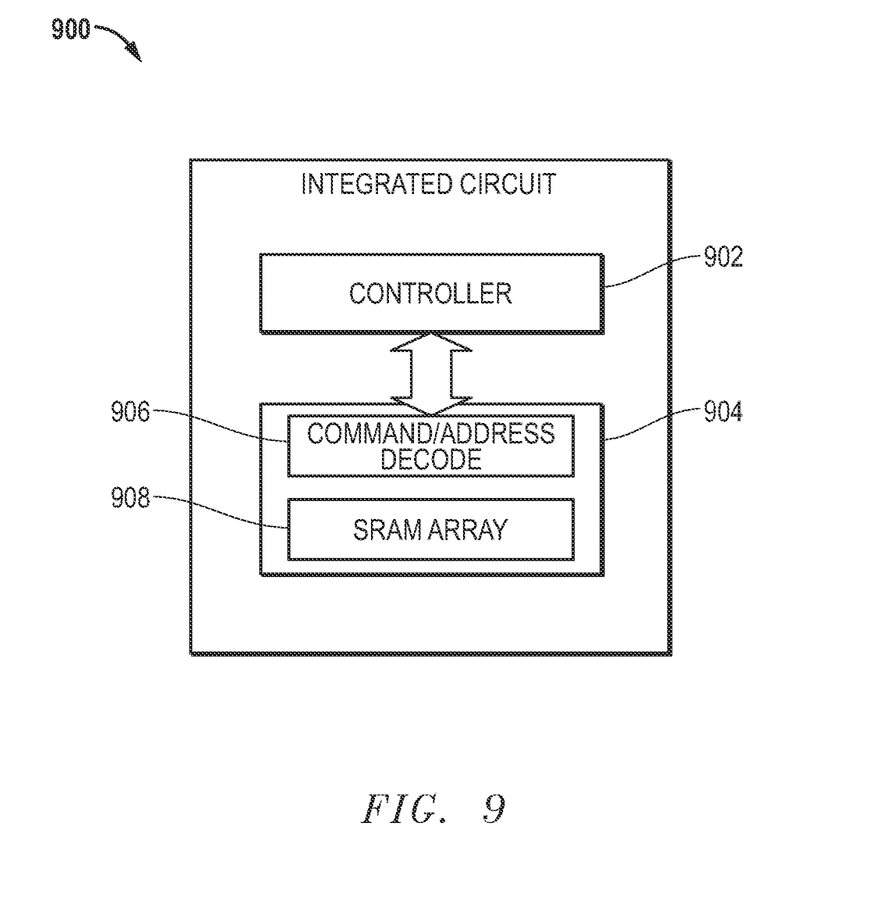
FIG. 9 illustrates in block diagram form a portion of an integrated circuit including SRAM circuits according to some embodiments.

Any of SRAM circuits 400, 600, and 800 may be embodied in SRAM memory in a variety of integrated circuits. Generally, each bitcell of an SRAM memory repeats the SRAM cell design and when combined with appropriate row and column circuitry can form a macrocell. FIG. 9 illustrates in block diagram form a portion of an integrated circuit ("IC") 900 including SRAM circuits according to some embodiments. Generally, the depicted portion of an IC 900 includes a controller 902 bidirectionally connected or coupled to an SRAM memory 904. SRAM memory 904 incudes command and address decode circuit 906, a data read and write circuit, and an SRAM array 908 including multiple SRAM bitcells. SRAM array 908 may employ any of SRAM circuits 400, 600, or 800 for each SRAM bitcell therein.

Generally, the SRAM circuits herein provide several advantages over a basic SRAM circuit such as SRAM circuit 100 (FIG. 1). The improved control of the precharge circuit allows for better timing margins at a given clock speed and generally improves speed of the SRAM circuit. The improved control of the keeper circuit and write driver circuit helps reduce occurrence of Read Before Write problems, and generally allows timing margins to be loosened. As can be understood, besides the Read Before Write performance improvements discussed above, the features of SRAM circuits 400, 600, or 800 also provide improved timing for other sequences. For a write followed by a read, because the circuit is able to start the write operation earlier (as compared to SRAM bitcell 100), the circuit will finish the write operation earlier, leaving more time for the subsequent read operation. When performing write operation after a write operation, the typical SRAM bitcell 100 generally needs to wait for the bit lines to be precharged fully to VDD before the next write is begun. However, the SRAM circuits herein have the freedom to not precharge the bit lines fully to VDD, allowing the subsequent write operation to begin earlier. There is a design tradeoff between the speed improvements and the increased area from the additional NAND or NOR gates, which increase the overall macrocell size for an SRAM circuit. However the speed and timing margin improvements make up for this in many scenarios. The SRAM circuits herein can run at higher speeds even in the face of process variations and voltage differences, including dual-rail SRAM circuits which supply two different voltages to their bitcells. Further, the improved control of the precharge circuits herein provides power savings by reducing "power races" between precharge circuits and write driver circuits.

An SRAM circuit, or portions thereof, described herein can be embodied one or more integrated circuits, any of which may be described or represented by a computer accessible data structure in the form of a database or other data structure which can be read by a program and used, directly or indirectly, to fabricate integrated circuits. For example, this data structure may be a behavioral-level description or register-transfer level (RTL) description of the hardware functionality in a high-level design language (HDL) such as Verilog or VHDL. The description may be read by a synthesis tool which may synthesize the description to produce a netlist including a list of gates from a synthesis library. The netlist includes a set of gates that also represent the functionality of the hardware including integrated circuits. The netlist may then be placed and routed to produce a data set describing geometric shapes to be applied to masks. The masks may then be used in various semiconductor fabrication steps to produce the integrated circuits. Alternatively, the database on the computer accessible storage medium may be the netlist (with or without the synthesis library) or the data set, as desired, or Graphic Data System (GDS) II data.

While particular embodiments have been described, various modifications to these embodiments will be apparent to those skilled in the art. For example, the particular combinatorial logic circuit employed may vary, with the overall performance providing the same functional features discussed above. Various types of SRAM bitcells may also be used, and the 6T bitcell illustrated above is given merely as one example. Further, dual rail SRAM bitcells may be used in which the word line is operated at a higher voltage than the write driver circuitry.

Accordingly, it is intended by the appended claims to cover all modifications of the disclosed embodiments that fall within the scope of the disclosed embodiments.

What is claimed is:

1. A static random-access memory (SRAM) circuit comprising:
   an SRAM bitcell coupled to a word line, a bit line and a complementary bit line;
   a precharge circuit coupled to the bit line and the complementary bit line and including a precharge input;
   a first keeper transistor with a drain connected to the bit line and a second keeper transistor with a drain connected to the complementary bit line;
   a write driver circuit including a select input receiving a select signal, a write data input, and a write data compliment input, and operable to write a data bit to the SRAM bitcell; and
   a combinatorial logic circuit providing a precharge signal to the precharge circuit based on the select signal and a bit line precharge signal, wherein the combinatorial logic circuit is operable to, responsive to the select signal arriving, stop a charging action of the precharge circuit before the bit line is fully charged to allow the write driver circuit to begin writing the data bit to the SRAM bitcell before the bit line is fully charged, and drive one of the first keeper transistor or the second keeper transistor as a pull up driver.

2. The SRAM circuit of claim 1, wherein:
   the first keeper transistor has a gate that is not connected to the complementary bit line and is driven based on a signal from the combinatorial logic circuit, and wherein the second keeper transistor has a gate that is not connected to the bit line and is driven based on a signal from the combinatorial logic circuit.

3. The SRAM circuit of claim 2, wherein the combinatorial logic circuit comprises:
   a NAND gate including a first input receiving a bit line precharge signal, a second input receiving the select signal, and an output connected to the precharge input.

4. The SRAM circuit of claim 3, wherein:
   the combinatorial logic circuit is further operable to activate the write driver circuit based on the select signal and a write data signal indicating the data bit, and a complimentary write data signal.

5. The SRAM circuit of claim 4, wherein the combinatorial logic circuit comprises:
   a first NOR gate with a first input receiving the select signal, a second input receiving the write data signal, and an output coupled a first transistor of the write driver circuit; and
   a second NOR gate with a first input receiving the select signal, a second input receiving a complementary write data signal, and an output coupled to a second transistor of the write driver circuit.

6. The SRAM circuit of claim 5, wherein the combinatorial logic circuit further comprises:

a first inverter with an input connected to the output of the first NOR gate and an output connected to a gate of the second keeper transistor; and a second inverter with an input connected to the output of the second NOR gate and an output connected to a gate of the first keeper transistor.

7. The SRAM circuit of claim 1, wherein:

the SRAM bitcell is supplied with a first voltage supply; and the write driver circuit is supplied with a second voltage supply having a voltage level higher than the first voltage supply.

8. A method of operating a static random-access (SRAM) memory circuit, comprising:

responsive to a precharge signal, charging a bit line and a complimentary bit line of an SRAM bitcell;

maintaining a charge level of the bit line with a first keeper transistor;

maintaining a charge level of the complimentary bit line with a second keeper transistor;

producing the precharge signal based on a select signal and a bit line precharge signal;

responsive to the select signal, ceasing to charge the bit line before the bit line is fully charged, thereby allowing writing the data bit to the SRAM bitcell to begin before the bit line is fully charged, and driving one of the first keeper transistor or the second keeper transistor as a pull up driver; and responsive to the select signal, writing the data bit to the SRAM bitcell.

9. The method of claim 8, further comprising:

the first keeper transistor is driven based on a signal from a combinatorial logic circuit without a connection to the complimentary bit line, and wherein the second keeper transistor is driven based on a signal from the combinatorial logic circuit without a connection to the bit line.

10. The method of claim 8, wherein:

producing the precharge signal is done by performing a NAND operation of a bit line precharge signal and the select signal.

11. The method of claim 8, wherein:

writing the data bit to the SRAM bitcell further comprises activating a write driver circuit based on the select signal and a write data signal indicating the data bit, and a complimentary write data signal.

12. The method of claim 11, wherein activating the write driver circuit based on the select signal and a write data signal indicating the data bit, and a complimentary write data signal further comprises:

performing a first NOR operation of the select signal and the write data signal, and coupling a result of the first NOR operation to a gate of a first transistor of the write driver circuit; and performing a second NOR operation of the select signal and a complimentary write data signal, and coupling a result of the second NOR operation to a gate of a second transistor of the write driver circuit.

13. The method of claim 12, further comprising:

inverting the result of the first NOR operation and coupling it to a gate of the second keeper transistor; and inverting the result of the second NOR operation and coupling it to a gate of the first keeper transistor.

14. The method of claim 8, further comprising:

supplying the SRAM bitcell with a first supply voltage; and supplying a write driver circuit with a second supply voltage having a voltage level higher than the first supply voltage.

15. An integrated circuit, comprising:

a static random-access memory (SRAM) circuit comprising:

an SRAM bitcell including a word line, a bit line and a complementary bit line;

a precharge circuit coupled to the bit line and the complementary bit line and including a precharge input;

a first keeper transistor with a drain connected to the bit line and a second keeper transistor with a drain connected to the complementary bit line;

a write driver circuit including a select input receiving a select signal, a write data input, and a write data compliment input, and operable to write a data bit to the SRAM bitcell; and a combinatorial logic circuit providing a precharge signal to the precharge circuit based on the select signal and a bit line precharge signal, wherein the first keeper transistor has a gate that is not connected to the complementary bit line and is driven based on a signal from the combinatorial logic circuit, and wherein the second keeper transistor has a gate that is not connected to the bit line and is driven based on a signal from the combinatorial logic circuit.

16. The integrated circuit of claim 15, wherein:

the first keeper transistor has a gate that is not connected to the complementary bit line and is driven based on a signal from the combinatorial logic circuit, and wherein the second keeper transistor has a gate that is not connected to the bit line and is driven based on a signal from the combinatorial logic circuit.

17. The integrated circuit of claim 15, wherein the combinatorial logic circuit comprises:

a NAND gate including a first input receiving a bit line precharge signal, a second input receiving the select signal, and an output connected to the precharge input.

18. The integrated circuit of claim 17, wherein:

the combinatorial logic circuit is further operable to activate the write driver circuit based on the select signal and a write data signal indicating the data bit, and a complimentary write data signal.

* * * * *